(12) United States Patent
Severijns et al.

(10) Patent No.: US 7,342,237 B2
(45) Date of Patent: Mar. 11, 2008

(54) LITHOGRAPHIC APPARATUS AND DEVICE MANUFACTURING METHOD

(75) Inventors: Ronald Walther Jeanne Severijns, Veldhoven (NL); Marcel Johannus Elisabeth Hubertus Muitjens, Nuth (NL); Sonia Margart Skelly, Veldhoven (NL); Theodorus Petrus Maria Cadee, Vlierden (NL)

(73) Assignee: ASML Netherlands B.V., Veldhoven (NL)

( * ) Notice: Subject to any disclaimer, the term of this patent is extended or adjusted under 35 U.S.C. 154(b) by 146 days.

(21) Appl. No.: 11/062,773

(22) Filed: Feb. 22, 2005

(65) Prior Publication Data

US 2006/0197036 A1 Sep. 7, 2006

(51) Int. Cl.
*H01J 21/00* (2006.01)

(52) U.S. Cl. .............................. 250/441.11; 250/440.11

(58) Field of Classification Search ........... 250/440.11, 250/441.11; 361/234
See application file for complete search history.

(56) References Cited

U.S. PATENT DOCUMENTS 5,191,218 A * 3/1993 Mori et al. ............. 250/453.11
5,999,589 A * 12/1999 Chiba et al. ................. 378/34

* cited by examiner

*Primary Examiner*—David Vanore
(74) *Attorney, Agent, or Firm*—Pillsbury Winthrop Shaw Pittman LLP (57) ABSTRACT

A lithographic apparatus comprising: an illumination system for providing a projection beam of radiation; a gas pressure controlled article clamp for clamping an article to be placed in a beam path of the projection beam of radiation; and a pressure circuit for controlling the article clamp, comprising a supply line for connection with the article clamp. According to the invention, a buffer volume is provided for providing a buffered gas pressure pulse in the supply line. In this way, faster clamp response times can be realized.

22 Claims, 6 Drawing Sheets

UNLOAD: normal valve; no volume  0.8 secs

Figure 5

UNLOAD: quick vacuum release  0.5 secs

Figure 6

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithography of IC and other devices, there is typically a demand for increasing the throughput of a lithographic apparatus as throughput typically relates to the profitability of the lithographic apparatus. Thus, there is a desire to quickly handle articles, such as substrates or patterning devices, that are involved in the lithographic process. However, due to the cleanliness and other limiting factors, only certain handling mechanisms can provide the handling of these articles into and within the lithographic apparatus. One of the mechanisms is a vacuum clamp which is used, for example, in the substrate handler to handle the substrates, for instance, when transported into and out of the lithographic apparatus. Such a vacuum clamp may also be used when the substrate is held on the substrate table for exposure. To provide the clamping action of the clamp, the clamp is coupled to a gas pressurizing device, comprising a pressure circuit that is connected to the article clamp.

SUMMARY

Due to size and/or weight of the gas pressurizing device, the gas pressurizing device is typically located a certain distance from the clamp, which means that the pressure circuit connecting the clamp to the gas pressurizing device introduces a volume that may be disadvantageous to the reaction times to be met for clamping or releasing the article. Indeed, a pressure that is provided by the gas pressurizing device must be built up in the volume of the connecting pressure circuit, which implies that a certain delay in response time is likely to occur when the distance between the gas pressurizing device and the clamp is large. A way to solve the problem is to reduce the volume of the supply line by shortening the lines. However, this is not always feasible.

Accordingly, it would be advantageous, for example, to improve the response time of an article clamp for a lithographic apparatus without violating design criteria and optionally to maintain the dimensioning and weight requirements of a conventional pressuring device and clamp.

According to an aspect of the invention, there is provided a lithographic apparatus, comprising:

a gas pressure controlled article clamp;

a pressure circuit configured to control the article clamp, the pressure circuit comprising a supply line connected to the article clamp; and a pulse pressure circuit configured to provide a gas pressure pulse in the supply line to reduce a response time of the clamp.

According to another aspect of the invention, there is provided a gas pressurizing device configured to control an article clamp in a lithographic apparatus, comprising:

a pressure circuit comprising a supply line connected to the article clamp; and a pulse pressure circuit configured to provide a gas pressure pulse in the supply line to reduce a response time of the clamp.

According to another aspect of the invention, there is provided a controller configured to control a clamping and/or releasing action of an article clamp in a lithographic apparatus, the article clamp connected to a supply line, the controller arranged to:

pressurize a pulse pressure circuit; and connect the pulse pressure circuit to the supply line to provide a gas pressure pulse in the supply line.

In another aspect of the invention, there is provided a method of operating an article clamp coupled to a pressurized supply line in a lithographic apparatus, comprising:

providing a first gas pressure in the supply line for providing a first operative state of the article clamp;

providing a gas pressure pulse in the supply line to reduce a transition time between the first operative state and a second operative state; and providing a second gas pressure in the supply line for providing the second operative state of the article clamp.

In this context, the term "pressurizing" is used for providing a predetermined pressure, which can be a high pressure or a vacuum pressure. Specifically, while pressurizing a buffer volume, the buffer volume is brought to a certain pressure level, which can be done by providing a persistent gas flow to or from the buffer volume depending on the desired pressure level.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
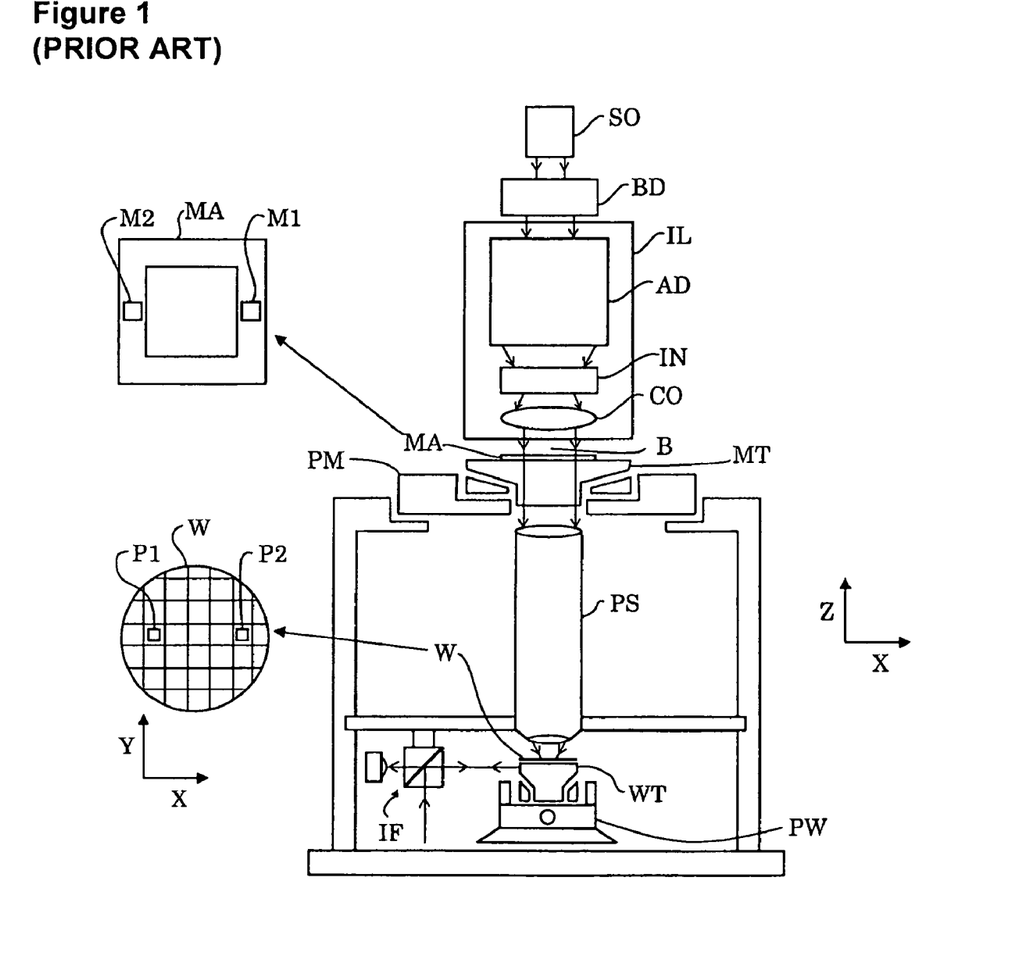
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table) MT, and is patterned by the patterning device. Having traversed the patterning device MA, the radiation beam B passes through the projection system PS, which focuses the beam onto a target portion C of the substrate W.

With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
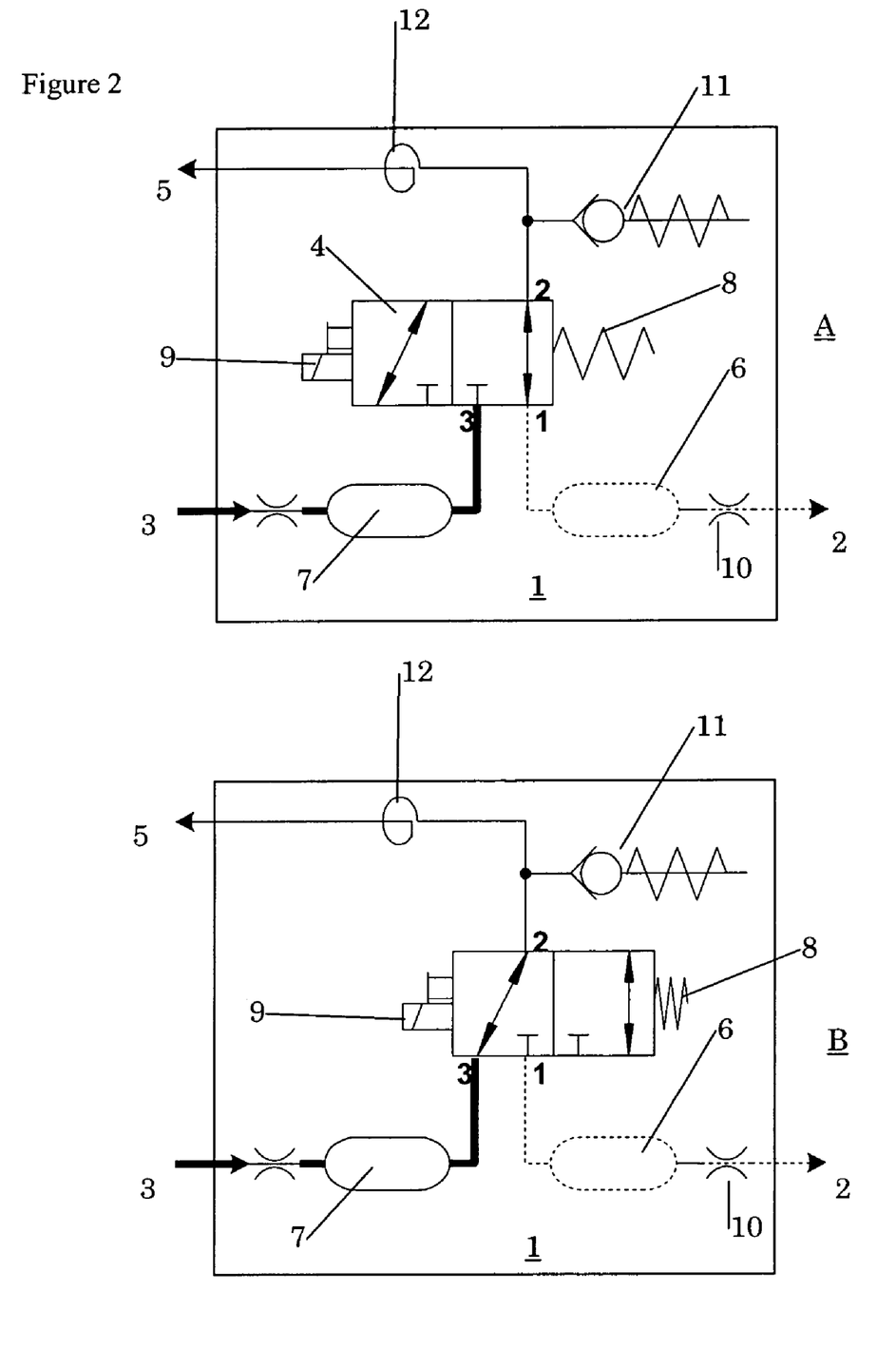
FIG. 2 depicts a gas pressurizing device switch configuration having a buffer volume according to an embodiment of the invention.

FIGS. 2A and 2B schematically depict two switching states of a gas pressurizing device 1 provided with a vacuum pressure line 2 (connected to a vacuum pump or the like, not depicted) and a high pressure line 3 (likewise, connected to a pump or the like to provide a pressure, for instance, higher than atmospheric pressure). In this embodiment, the device 1 comprises a switch/release valve 4 switching between the high pressure line 3 and the vacuum pressure line 2. Depending on the switch configuration, a high or vacuum pressure is provided in a supply line 5. In the device 1, for the vacuum and high pressure lines 2 and 3, a buffer volume 6, 7 respectively is provided. The supply line 5 can be connected to a clamp, such as a mask clamp, a substrate clamp or more generally a gas pressure controlled article clamp configured to clamp an article, for example, to be placed in a beam path of the projection beam of radiation (not depicted).

The buffer volumes 6 and 7 are configured to provide a buffered gas pressure pulse in the supply line 5 as will be further described. To this end, the buffer volumes 6, 7 respectively can be pressurized prior to connecting the buffer volume 6 or 7 to the supply line 5. This can be done by actuating the switch/release valve 4 using a controller (not depicted).

In the switch position depicted in FIG. 2A, a spring 8 pushes the switch/release valve 4 into a rest position where a connection is provided between the vacuum pressure line 2 and the supply line 5. In this configuration, gas flows via the vacuum buffer volume 6 and a vacuum pressure is provided to the supply line 5. Further, in this configuration, the high pressure line 3 is disconnected from the supply line 5. However, the buffer volume 7 is pressurized in this configuration by gas flowing persistently into the buffer volume 7.

When the gas pressurizing device 1 is switched (using a controller) by the switch/release valve 4 to the second switch position depicted in FIG. 2B, the spring 8 is compressed by a solenoid 9 and the vacuum pressure line 2 is disconnected from the supply line 5. In the same switching action, the pressurized buffer volume 7 is connected to the supply line 5. Since a pressure difference is present between the buffer volume 7 and the supply line 5, by connection, a buffered gas pressure pulse is provided to the supply line 5. Depending on the volume and pressure differences, the pressure pulse is leveled and after the initial push, the high pressure line 3 supplies a gas flow into the supply line 5 via the buffer volume 7. By the initial buffered gas pressure pulse, the vacuum pressure that is present in the supply line 5 is quickly removed and the pressure in the supply line 5 is rapidly brought to a desired level. This level can, for instance, be used for decoupling a clamp, that is, instead of a vacuum pressure that provides clamping action, the vacuum pressure is actively converted to a higher pressure by providing a pressure pulse of a high pressure supply line 3. This push can be dimensioned to provide a desired pressure level, which can be an atmospheric pressure level (no active decoupling) but also a pressure level where the clamp actively decouples by overshooting the pressure level, for instance, by a pressure pulse actively pushing a substrate off of a substrate holder.

In the alternative state depicted in the FIG. 2B position, the high pressure line 3 is connected to the supply line 5, and a desired high pressure level is provided to the supply line 5, the vacuum pressure line 2 being disconnected from the supply line 5. In this configuration, the vacuum pressure line 2 evacuates the buffer volume 6. Thus, a relatively high vacuum pressure is provided in the buffer volume 6 by draining the vacuum pressure line 2 via restrictor 10.

Restrictor 10 protects the vacuum pressure line when the supply line 5 is unloaded, that is, for instance, when the supply line 5 is uncoupled or not used for clamping a substrate.

When the vacuum pressure line 2 is reconnected by the controller to the supply line 5, this vacuum buffer volume provides a rapid pressure pulse thus quickly reducing the pressure level in the supply line 5 to a required vacuum pressure level. Thus, the response time for providing a vacuum pressure level to clamp an article can be reduced.

A relief valve 11 may be provided to limit pressure levels. A coupling element 12 may be provided to provide a coupling between the device 1 and the clamp (not depicted), for instance, of a dynamic nature to serve as a transition between a stabilized clamp environment and an 'outside' world where the bulk of the pressurizing device 1 is positioned.

Figure 3:
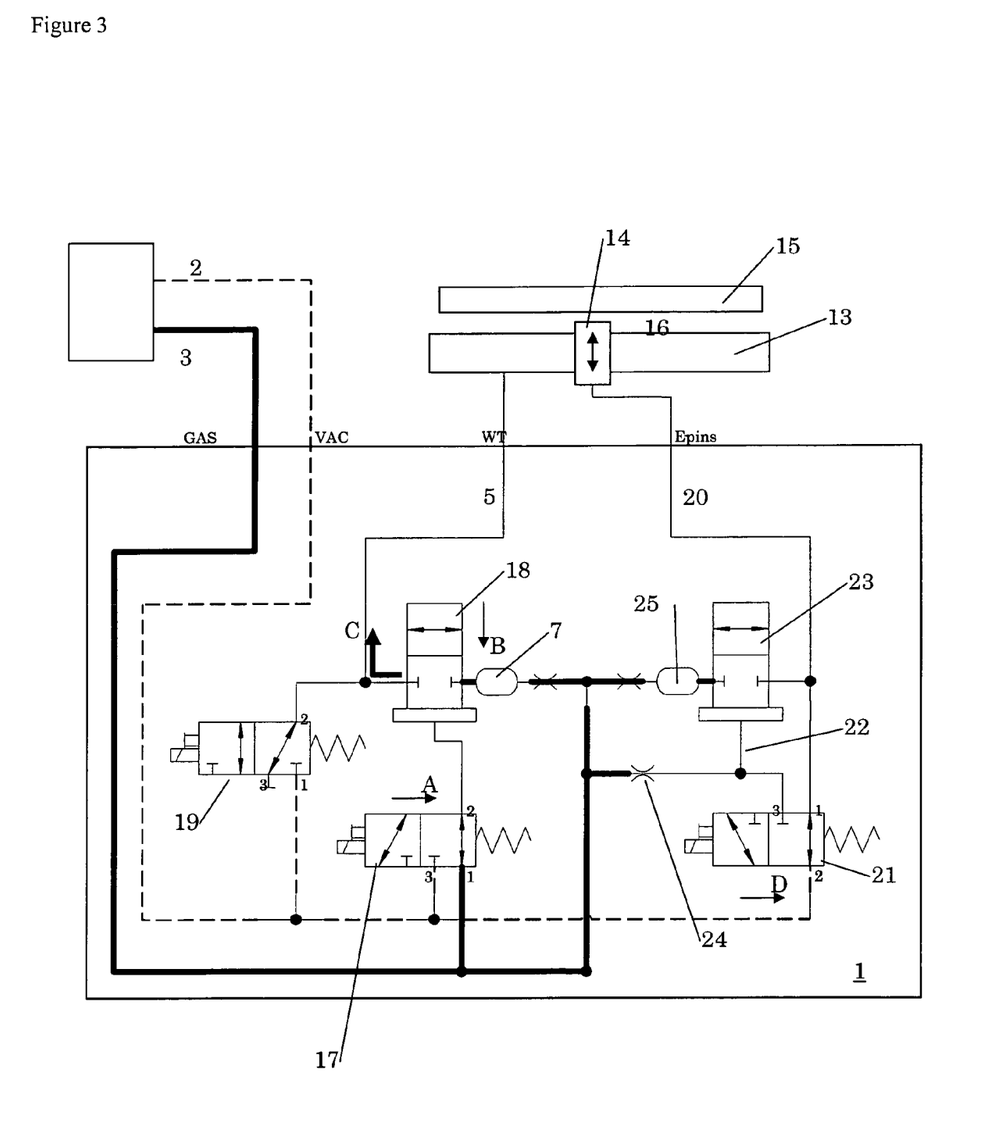
FIG. 3 depicts a gas pressurizing device configured to pressurize a substrate table and associated substrate handling equipment according to an embodiment of the invention.

FIG. 3 shows an embodiment of a pressurizing device 1, in a lithographic apparatus, configured to vacuum clamp an article 15 on an article support 13 and to pressurize an article lifting device 14 to lift an article 15 from the article support 13. The article support 13 may be of a conventional nature, that is, an article support 13 provided with one or more suction ports to actively suck the article 15 to the article support 13. The lifting device 14 may be of a conventional nature, that is, comprising one or more suction ports to suck the article to the lifting device 14. The vacuum pressures that are provided to the lifting device 14 and to the article support 13 are time controlled, that is, when an article 15 is provided to the article support 13, the vacuum pressure is shut off from the lifting device 14 and the lifting device 14 is brought out of contact with the article 15. Vice versa, when the lifting device 14 is brought in contact with the article 15, for example by upwards movement of the lifting device 14, the article support 13 is decoupled from the vacuum pressure of the vacuum pressure line 2 via supply line 5. Further, the lifting device 14 may be coupled to the vacuum pressure line 2 via supply line 5, so that the article 15 is clamped to the lifting device 14. By lifting the article 15, the article 15 is decoupled from the article support 13. However, remaining clamping forces may delay the lifting of the article 15 from the article support 13. These clamping forces are caused by remaining vacuum pressure below the article 15 and also "sticking" forces between the article 15 and the article support 13. Particularly in immersion lithographic apparatus, overcoming these clamping forces may be problematic since it is expected that the sticking will increase in such wet environments. Thus, it would be advantageous, for example, to reduce or minimize the delay to overcome the vacuum pressure 16 below the article 15 which actively clamps the article 15 to the article support 14.

To this end, when the connection between the vacuum pressure line 2 and the supply line 5 is shut off from the article support 13, a positive pressure (higher than atmospheric pressure) is provided via supply line 5 to quickly remove the vacuum pressure 16. Referring to FIG. 3, the solenoid 17 is actuated in the direction of arrow A to cause the vacuum pressure line 2 to be connected to the valve 18, which moves in the direction of arrow B, and which connects the high pressure line 3 to the supply line 5. Indeed, via direction C, a pressure pulse propagates into the supply line 5 due to the release of the gas in the pressured buffer volume 7 (The vacuum pressure to the article support 13 via valve 19 being closed at that time). Thus, a high pressure pulse is provided to the supply line 5, which assists in a rapid resolution of the vacuum pressure 16 below the article. By dimensioning the gas flow via buffer volume 7, the pressure pulse can be controlled to provide a pulse height and width of a desired nature.

The operation of the second supply line 20 to supply pressure to the lifting device 14 is of a similar nature as discussed above. In the depicted configuration, the vacuum pressure line 2 is connected to the supply line 20 via valve 21 to supply a vacuum pressure to the lifting device 14, also known as an ejection pin. This vacuum pressure is shut off from the lifting device 14 by moving the valve 21 in direction D. At the same time as the vacuum pressure is shut off, the vacuum pressure line 2 is coupled to a line 22 to actuate the valve 23. Flow restrictor 24 prevents a short circuit and the valve 23 is actuated to provide a connection between the pressurized buffer volume 25 and the supply line 20. Thus, a pressure pulse is provided in the supply line 20, quickly resolving the vacuum condition in the supply line.

Figure 4:
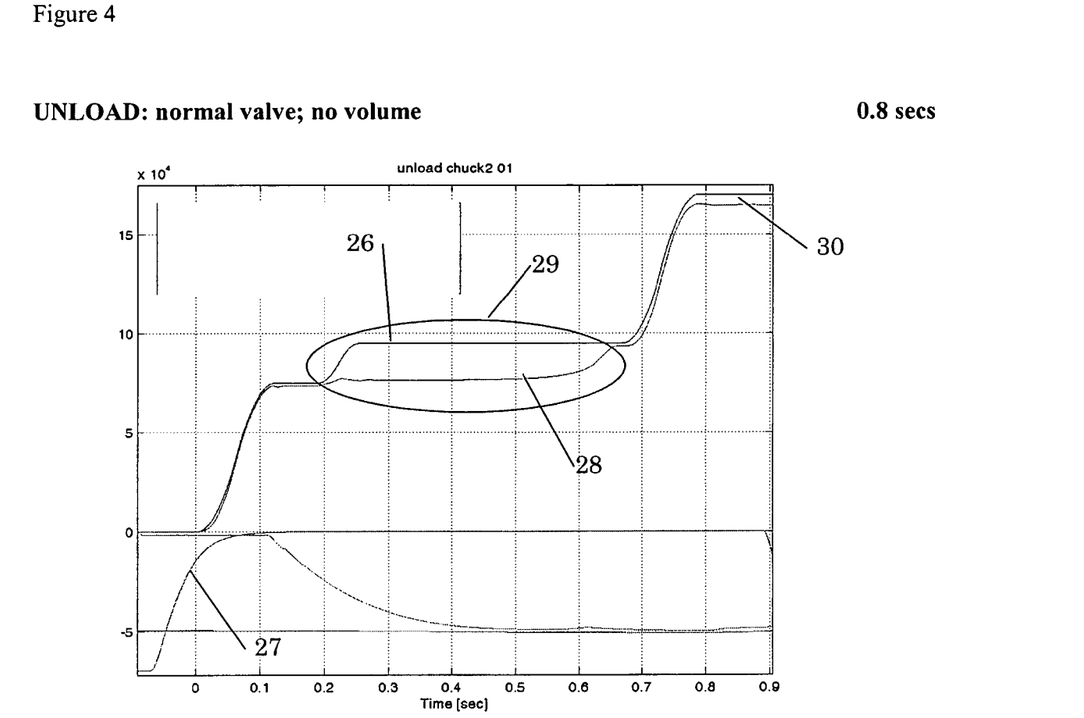
FIG. 4 illustrates a graph of test results for a conventional release method to release a substrate from a substrate table.
Figure 5:
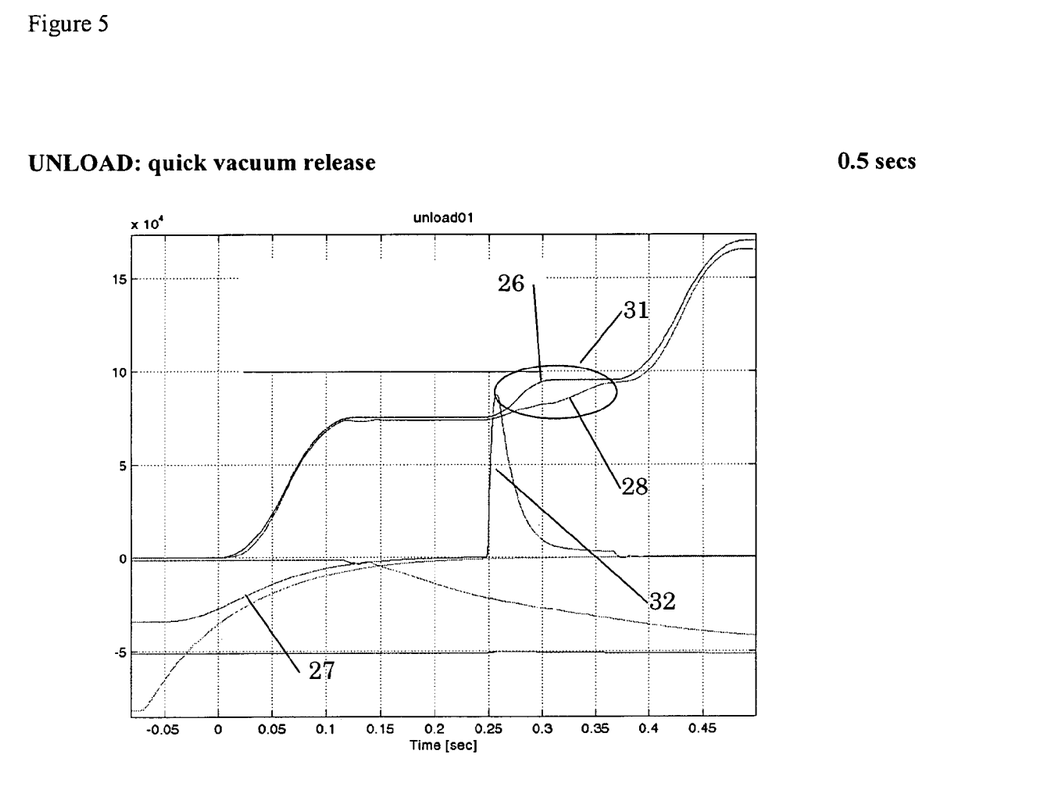
FIG. 5 illustrates a graph of test results for a release method to release a substrate from a substrate table according to an embodiment of the invention using a pressure pulse from a buffer volume.

To further illustrate the operation of the embodiment illustrated in FIG. 3, a comparative test result is shown in FIG. 4 (no buffer volume) and FIG. 5 (wherein the buffer volume was used to provide a quick release action of the article support).

In FIG. 4, the upper two lines 26, 28 indicate the height progression (arbitrary units) of an article lifted from an article support by one or more ejection pins. To this end, a theoretic set point curve 26 (a desired position of the ejection pin(s)) is depicted, which is followed by the actual height curve 28 registered by the ejection pin(s). The progression of time is shown on the X-axis. It can be seen that after releasing the vacuum pressure of the article support, the pressure 27 rises to atmospheric pressure permitting the article to be released. In the same time frame, the ejection pins(s) are moved upward (indicated by line 28) according to the set point curve 26. However, after an initial period, the ejection pin(s) movement 28 is counteracted by the vacuum pressure and sticking forces that inhibit the ejection pin(s) movement 28 from following the set point curve 26 as is evident from the region 29. After about 0.5 second, the vacuum pressure is eliminated and the ejection pin(s) movement 28 progresses further according to the set point curve 26. The release time is about 0.8 second when the ejection pin(s) reaches the highest level 30.

In FIG. 5 the theoretic set point curve 26 is depicted again, which is followed by the actual height curve 28 registered by the ejection pin(s). This graph illustrates the quick-release action that can be provided by the buffered gas pressure pulse in the supply line. Here, again, after releasing the vacuum pressure of the article support, the pressure line 27 rises to atmospheric pressure permitting the article to be released. In the same time frame, the ejection pins(s) move upward according to the set point curve 26. Likewise, after an initial period, the ejection pin(s) movement 28 is counteracted by vacuum pressure conditions and sticking forces that inhibit the ejection pin(s) movement 28 from following the set point curve 26 as is evident from the region 31. To compensate, according to an embodiment of the invention, a pressure pulse 32 is provided to the supply line. The pressure pulse assists in a rapid reduction or elimination of the vacuum pressure below the article. After about 0.1 second, the vacuum pressure is reduced or eliminated and the ejection pin(s) movement 28 continues further according to the set point curve 26. The release time is about 0.4 sec when the ejection pin(s) reaches the highest level 30, a release time of the article significantly shorter than a convention release action.

Figure 6:
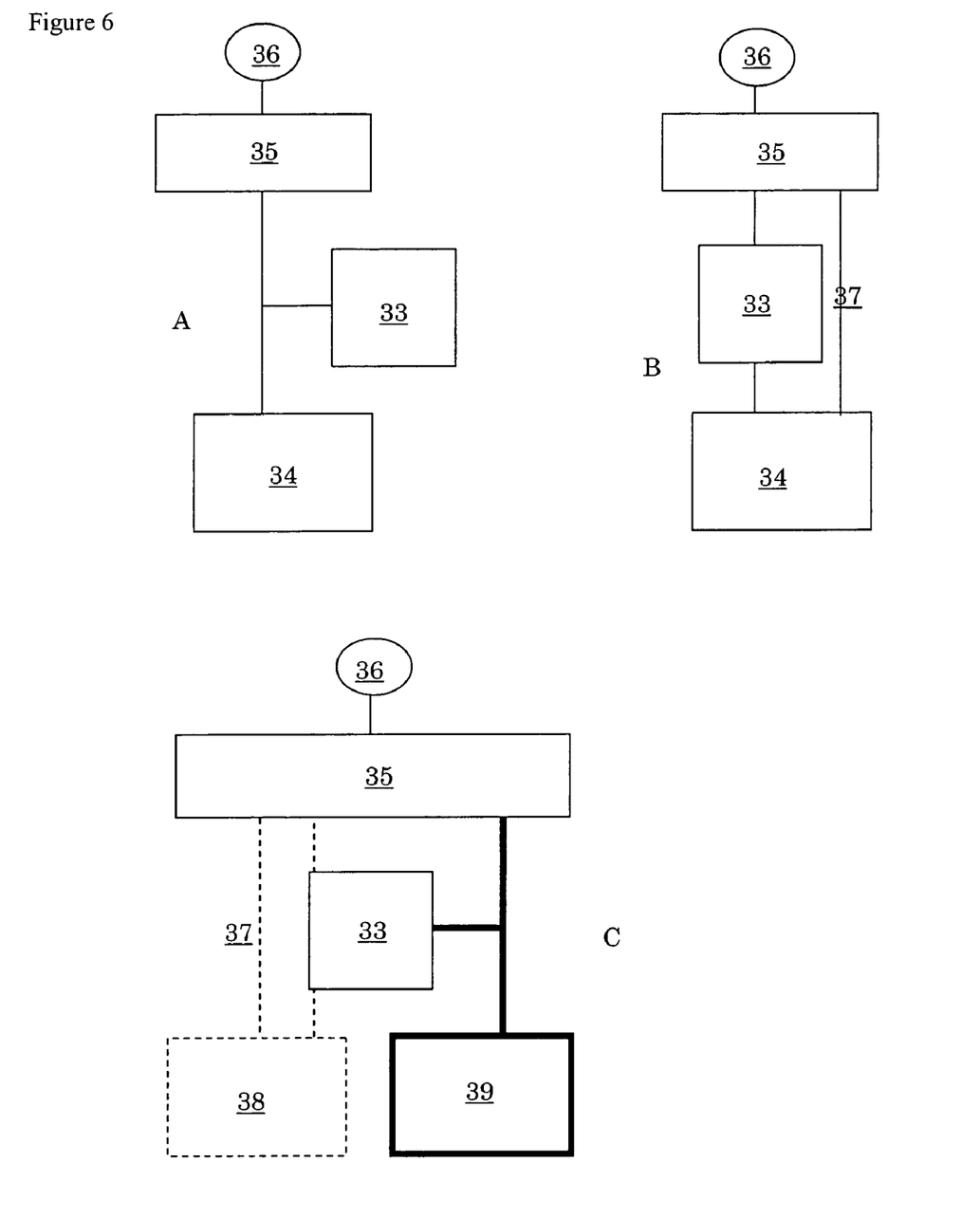
FIG. 6 depicts various schematic circuit arrangements according to one or more embodiments of the invention.

FIG. 6 illustrates some further embodiments according to the invention. FIG. 6A illustrates a pulse circuit 33 provided parallel to a pressure circuit 34, both connected to a supply line 35 connected to a clamp 36. The supply line 35 may be switched to alternately connect to the pulse circuit 33 and the pressure circuit 34.

FIG. 6B illustrates a pulse circuit 33 arranged serially with a pressure circuit 34 and a supply line 35, the supply line 35 connected to a clamp 36. A bypass line 37 is provided to directly connect the pressure circuit 34 to the supply line 35. For instance, when a vacuum level is reached but an even deeper vacuum is required, the connection to the pulse circuit 33 can be closed and the supply line 35 can be connected directly to the pressure circuit 34. By doing so, the pulse circuit 33 is provided to give a first "push" to provide a first vacuum level in the supply line 35 and then the main pressure circuit 34 is used to further deepen the vacuum in the supply line 35 to a second vacuum level. At the same time, the pulse pressure circuit 33 may be restored to an initial state by parallel connection to the pressure circuit 34. Alternatively, the pulse pressure circuit 33 can be reconnected to the main pressure circuit 34 after the required pressure level is reached in the supply line 35 to avoid disturbances in the system.

FIG. 6C illustrates a pressure pulse circuit 33 serially connected with a vacuum pressure circuit 38 and a supply circuit 35, the supply circuit 35 connected to a clamp 36. The pulse pressure circuit 33 can be bypassed by a bypass 37. The pulse pressure circuit 33 is also connected in parallel to a high pressure circuit 39. The pulse pressure circuit 33 can be arranged to both provide a vacuum pressure pulse and a high pressure pulse to the supply line 35 depending on switch configuration.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   a gas pressure controlled article clamp;
   a pressure circuit configured to control the article clamp, the pressure circuit comprising a supply line connected to the article clamp; and
   a pulse pressure circuit configured to provide a gas pressure pulse during a reduction or increase of pressure in the supply line to reduce a response time of the clamp.

2. The apparatus according to claim 1, wherein the pressure circuit comprises a vacuum pressure line configured to provide a vacuum pressure pulse for quick clamping action of the article clamp.

3. The apparatus according to claim 1, wherein the pressure circuit comprises a high pressure line configured to provide a high pressure pulse for quick release action of the article clamp.

4. The apparatus according to claim 1, wherein the pressure circuit comprises a high pressure line configured to provide a high pressure pulse for quick release action of the article clamp and the high pressure line and a vacuum pressure line share a common valve configured to alternates between the lines.

5. The apparatus according to claim 1, wherein the pressure circuit comprises a bypass line configured to bypass the pulse pressure circuit.

6. The apparatus according to claim 1, wherein the pressure circuit comprises a flow restrictor.

7. The apparatus according to claim 6, wherein the flow restrictor is provided between the pressure circuit and the pulse pressure circuit.

8. The apparatus according claim 1, wherein the pressure circuit comprises a pressure relief valve.

9. The apparatus according to claim 1, wherein the pulse pressure circuit comprises a release valve and a buffer volume, the release valve provided between the buffer volume and the supply line, and comprising a controller configured to pressurize the buffer volume prior to releasing the release valve.

10. The apparatus according to claim 9, further comprising a relief valve and/or a flow restrictor between the buffer volume and the supply line.

11. The apparatus according to claim 9, further comprising a flow restrictor between the buffer volume and the pressure circuit.

12. The apparatus according to claim 1, wherein the article clamp comprises a substrate support, a substrate handler, a patterning device support or a patterning device handler.

13. A gas pressurizing device configured to control an article clamp in a lithographic apparatus, comprising:
   a pressure circuit comprising a supply line connected to the article clamp; and
   a pulse pressure circuit configured to provide a gas pressure pulse during a reduction or increase of pressure in the supply line to reduce a response time of the clamp.

14. The device according to claim 13, wherein the pressure circuit comprises a vacuum pressure line.

15. The device according to claim 13, wherein the pressure circuit comprises a high pressure line.

16. The device according to claim 15, wherein the pressure circuit comprises a high pressure line and wherein the high pressure line and a vacuum pressure line share a common valve configured to alternates between the high and vacuum pressure lines.

17. The device according to claim 13, wherein the pressure circuit comprises a bypass line configured to bypass the pulse pressure circuit.

18. The device according to claim 13, wherein the pulse pressure circuit comprises a release valve and a buffer volume, the release valve provided between the buffer volume and the supply line, and comprising a controller configured to pressurize the buffer volume prior to releasing the release valve.

19. A controller configured to control a clamping and/or releasing action of an article clamp in a lithographic apparatus, the article clamp connected to a supply line, the controller arranged to:
   pressurize a pulse pressure circuit; and
   connect the pulse pressure circuit to the supply line to provide a gas pressure pulse during a reduction or increase of pressure in the supply line.

20. A method of operating an article clamp coupled to a pressurized supply line in a lithographic apparatus, comprising:
   providing a first gas pressure in the supply line for providing a first operative state of the article clamp;
   providing a gas pressure pulse in the supply line to reduce a transition time between the first operative state and a second operative state; and
   providing a second gas pressure in the supply line for providing the second operative state of the article clamp.

21. The method according to claim 20, wherein the pressure pulse is provided by:
   pressurizing a pulse pressure circuit; and
   connecting the pulse pressure circuit to the supply line to provide the pressure pulse in the supply line.

22. A method according to claim 21, comprising pressurizing the pulse pressure circuit by a persistent gas flow.

* * * * *